United States Patent [19]

Bloom et al.

[11] Patent Number: 5,387,490
[45] Date of Patent: Feb. 7, 1995

[54] METHOD OF PREPARING A LAMINAR THERMAL IMAGING MEDIUM

[75] Inventors: Iris B. K. Bloom, Waltham; Richard A. Minns, Arlington, both of Mass.

[73] Assignee: Polaroid Corporation, Cambridge, Mass.

[21] Appl. No.: 96,662

[22] Filed: Jul. 23, 1993

Related U.S. Application Data

[62] Division of Ser. No. 923,720, Jul. 31, 1992, Pat. No. 5,275,914.

[51] Int. Cl.$^6$ ............................................. G03C 3/00
[52] U.S. Cl. ...................................... 430/253; 430/256; 430/258; 430/270
[58] Field of Search ................ 430/253, 256, 270, 258

[56] References Cited

U.S. PATENT DOCUMENTS

| | | | |
|---|---|---|---|
| 2,616,961 | 11/1952 | Groak | 178/5.2 |
| 3,241,973 | 3/1966 | Thommes | 96/115 |
| 3,257,942 | 6/1966 | Ritzerfeld et al. | 101/149.4 |
| 3,340,086 | 9/1967 | Groak | 117/36.4 |
| 3,396,401 | 8/1968 | Nonomura | 346/1 |
| 3,592,644 | 7/1971 | Vrancken et al. | 96/27 |
| 3,632,376 | 1/1972 | Newman | 117/35.5 |
| 3,770,438 | 11/1973 | Celeste | 96/67 |
| 3,882,187 | 5/1975 | Takiyama et al. | 260/835 |
| 3,924,041 | 12/1975 | Miyayama et al. | 428/212 |
| 3,928,299 | 12/1975 | Rosenkranz et al. | 260/89.5 |
| 4,081,418 | 3/1978 | Barua et al. | 260/29.6 |
| 4,123,578 | 10/1978 | Perrington et al. | 428/206 |
| 4,141,806 | 2/1979 | Keggenhoff et al. | 204/159.22 |
| 4,157,412 | 6/1979 | Deneau | 428/147 |
| 4,234,674 | 11/1980 | Woodbrey et al. | 430/253 |
| 4,246,382 | 1/1981 | Honda et al. | 526/79 |
| 4,252,879 | 2/1981 | Inoue et al. | 430/9 |
| 4,303,485 | 12/1981 | Levens | 204/159.24 |
| 4,309,331 | 1/1982 | Graham | 260/30.6 R |
| 4,314,044 | 2/1982 | Hughes et al. | 260/29.6 M |
| 4,347,300 | 8/1982 | Shimazu et al. | 430/156 |
| 4,369,299 | 1/1983 | Honda et al. | 526/329.7 |
| 4,710,446 | 12/1987 | Hoffmann et al. | 430/281 |
| 4,713,412 | 12/1987 | Czerpinski et al. | 524/833 |
| 5,026,742 | 6/1991 | Rehmer | 522/116 |
| 5,155,003 | 10/1992 | Chang | 430/200 |
| 5,200,297 | 4/1993 | Kelly | 430/253 |

FOREIGN PATENT DOCUMENTS

| | | |
|---|---|---|
| 2281969 | 4/1976 | France . |
| 1156996 | 7/1969 | United Kingdom . |
| 2020838 | 11/1979 | United Kingdom . |
| WO88/04237 | 6/1988 | WIPO . |

*Primary Examiner*—Charles L. Bowers, Jr.
*Assistant Examiner*—Geraldine Letscher
*Attorney, Agent, or Firm*—David J. Cole

[57] ABSTRACT

A laminar thermal imaging medium is prepared from a first element comprising a first sheet transparent to image-forming radiation and having at least a surface zone or layer of polymeric material heat-activatable upon subjection of the thermal imaging medium to brief and intense radiation, the first element carrying a layer of porous or particulate image-forming substance having cohesivity in excess of its adhesivity for the polymeric heat-activatable layer, and, on the opposed side of the layer of porous or particulate image-forming substance from the surface zone or layer, a first layer of adhesive, and a second element comprising a second sheet carrying a second layer of adhesive. One of the first and second layers of adhesive comprises a polymeric hardenable adhesive comprising a macromolecular organic binder having amino or substituted amino groups, and a photopolymerizable monomer. The first and second elements are laminated together with the first and second layers of adhesive in contact with one another, so forming a unitary laminar medium in which the hardenable adhesive remains in its unhardened condition and serves to reduce the tendency for the unitary laminar medium to delaminate on application of stresses to the medium. Only a short lag time, typically about 30 seconds, is required between lamination and curing of the hardenable adhesive in order to provide a strong bond between the two elements following curing.

8 Claims, 1 Drawing Sheet

METHOD OF PREPARING A LAMINAR THERMAL IMAGING MEDIUM

This application is a division of application Ser. No. 07/923,720, filed Jul. 31, 1992 (now U.S. Pat. No. 5,275,914).

REFERENCE TO RELATED APPLICATIONS

Attention is directed to copending Application U.S. Ser. No. 07/616,853, filed Nov. 21, 1990 and assigned to the same assignee as the present application; this copending application describes and claims a laminar thermal imaging medium having a polymeric hardenable adhesive layer, this hardenable adhesive layer being capable in its unhardened condition of reducing the tendency for the laminar thermal imaging medium to delaminate on application of physical stresses to the medium and being hardenable to a layer of sufficient hardness to provide a durable base for the image formed by exposure of the medium.

Attention is also directed to copending application U.S. Ser. No. 07/798,899 (now U.S. Pat. No. 5,229,247), assigned to the same assignee as the present application; this copending application describes and claims a laminar thermal imaging medium generally similar to that described in the aforementioned application Ser. No. 07/616,853 in which the photohardenable adhesive layer comprises a macromolecular organic binder and a photopolymerizable ethylenically unsaturated monomer, the imaging medium also comprising a polymeric elastic and non-brittle layer which resists diffusion of the photopolymerizable ethylenically unsaturated monomer therethrough in order to prevent this monomer diffusing into certain other layers of the imaging medium.

The disclosures of both the aforementioned copending applications are herein incorporated by reference.

BACKGROUND OF THE INVENTION

This invention relates to an adhesive composition, and to an imaging medium comprising this adhesive composition. More particularly, this invention relates to a laminar imaging medium having improved resistance to stress-induced delamination.

The provision of images by resort to media which rely upon the generation of heat patterns is well known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing thermally generated symbols, patterns or other images have been reported. Examples of these can be found in U.S. Pat. No. 2,616,961 (issued Nov. 4, 1952 to J. Groak); in U.S. Pat. No. 3,257,942 (issued Jun. 28, 1966 to W. Ritzerfeld, et al.); in U.S. Pat. No. 3,396,401 (issued Aug. 6, 1968 to K. K. Nonomura); in U.S. Pat. No. 3,592,644 (issued Jul. 13, 1971 to M. N. Vrancken, et al.); in U.S. Pat. No. 3,632,376 (issued Jan. 4, 1972 to D. A. Newman); in U.S. Pat. No. 3,924,041 (issued Dec. 2, 1975 to M. Miyayama, et al.); in U.S. Pat. No. 4,123,578 (issued Oct. 31, 1978 to K. J. Perrington, et al.); in U.S. Pat. No. 4,157,412 (issued Jun. 5, 1979 to K. S. Deneau); in United Kingdom Patent Specification No. 1,156,996 (published Jul. 2, 1969 by Pitney-Bowes, Inc.); and in International Patent Application No. PCT/US87/03249 of M. R. Etzel (published Jun. 16, 1988, as International Publication No. WO 88/04237).

In the production of a thermally actuatable imaging material, it may be desirable and preferred that an image-forming substance be confined between a pair of sheets in the form of a laminate. Laminar thermal imaging materials are, for example, described in the aforementioned U.S. Pat. Nos. 3,924,041 and 4,157,412 and in the aforementioned International Patent Application No. PCT/US87/03249. It will be appreciated that the sheet elements of a laminar medium will afford protection of the image-forming substance against the effects of abrasion, rub-off and other physical stimuli. In addition, a laminar medium can be handled as a unitary structure, thus, obviating the requirement of bringing the respective sheets of a two-sheet imaging medium into proper position in a printer or other apparatus used for thermal imaging of the medium material.

In the aforementioned International Patent Application No. PCT/US87/03249, there are described certain preferred embodiments of a high resolution thermal imaging medium, which embodiments include a porous or particulate image-forming substance (e.g., a layer of pigment and binder) confined in a laminate structure between a pair of sheets. Upon separation of the respective sheets, after laser exposure of portions or regions of the medium, a pair of complementary images is obtained. Among the laminar embodiments of International Patent Application No. PCT/US87/03249 are those which include: a first sheet transparent to image-forming radiation and having at least a surface zone or layer of polymeric material which is heat-activatable upon subjection of the medium to brief and intense radiation; a layer of porous or particulate image-forming substance thereon; and a second sheet laminated and adhesively secured to the first sheet.

Upon exposure of regions or portions of the medium to brief and intense image-forming radiation, and conversion of absorbed energy to heat for activation of the heat-activatable polymeric material, corresponding regions or portions of the image-forming substance are caused to be more firmly attached or locked to the first sheet. Abutting regions or portions of image-forming substance which are not subjected to such image-forming radiation are, upon separation of the first and second sheets, removed by the adhesive second sheet, for formation of an image complementary to the image on the first sheet. In preferred thermal imaging media of the aforementioned International Application, a release layer is provided over the porous or particulate image-forming substance to facilitate proper separation of the respective first and second sheets and formation of the respective complementary images.

The respective images obtained by separating the sheets of an exposed thermal imaging medium having an image-forming substance confined therebetween, such as a laminar image medium of the type described in the aforementioned International Application, may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of and nature of additional layer(s) in the medium, and upon the manner in which such layers fail adhesively or cohesively upon separation of the sheets. Either of the pair of images may, for reasons of informational content, aesthetics or otherwise, be desirably considered the principal image. The principal image may, however, depending upon the aforementioned properties and modes of failure, exhibit decidedly inferior properties, such as poorer handling characteristics, durability and abrasion resistance, as compared with the complementary image of secondary importance.

In the production of thermal images from media having "first" and "second" sheets, of the type described in the aforementioned International Application, it will oftentimes be preferred, in the case of high density images, that the principal image be that which is formed on the second sheet by transfer of non-exposed regions of coated image-forming substance. It will be recognized that an alternative is to form a high density image on the first (opposed) sheet by firmly attaching the image-forming substance in areas of exposure. This is the case because the medium provides complementary images and the desired high density image can be formed on either sheet by addressing the thermally actuatable medium according to which sheet shall bear the high density image. Formation of a high density image on the first sheet is, however, disadvantageous since the areas of high density are created in areas of exposure (by activation of a heat-activatable image-forming zone or layer) and large areas of image-forming substance require correspondingly large areas of laser actuation and energy utilization and highly accurate laser scanning and tracking. Errors in tracking will result in discontinuities (whiteness or voids) by failure to attach minute regions of image-forming substance and by their removal to the opposed (second) sheet upon separation of the sheets. Owing to the psychophysical nature of human vision, minute regions of lightness (voids) against an expansive darkness tend to be noticeable.

It will, thus, be preferred that a high density image be the result of the transfer in non-exposed regions of coated and continuous regions of image-forming material (with minimal or no discontinuities or coverage voids), rather than the result of firm connection of high density regions of imaging material by laser-actuated operation of the heat-activatable image-forming surface, where tracking errors increase the possibility of creating noticeable areas of discontinuity (whiteness) against the expansive high density region.

Inasmuch as the formation of a preferred image in non-exposed portions of image-forming substance will be the result of the removal of such substance from an opposed sheet with the aid of an adhesive sheet, the adhesive thereof will serve as a base for the image carried by the sheet. The nature of the adhesive, and especially its physical properties, may influence image quality and certain physical attributes of the image, such as the handling properties and durability of the image. If the wrong adhesive is used, the laminar medium material may exhibit an undesirable tendency to delaminate upon subjection to certain physical stresses that may be created during a manufacturing operation (e.g., bending, winding, cutting or stamping operations). It may be desirable in some instances to form a laminar medium from a pair of endless sheet or web materials and to then cut, slit or otherwise provide therefrom individual film units of predetermined size. A reciprocal curing and stamping operation used for the cutting of individual film units may create stress influences in the medium, causing the sheets to separate at the interface of weakest adhesivity—typically, at the interface where, by thermal actuation, the preferential adhesion of the image-forming substance would be reversed.

In the aforementioned copending application Ser. No. 07/616,853, and in the corresponding International Patent Application No. PCT/US91/08585 (Publication No. WO 92/09441), there is disclosed an improved thermal imaging medium including a polymeric hardenable adhesive layer which in its unhardened condition serves to laminate the sheets of the medium into a unitary medium having a reduced tendency to delaminate upon subjection to physical stresses and which, upon subsequent hardening (curing), provides sufficient hardness to provide improvements in image handling and durability; thus, the hardenable adhesive provides a first degree of adhesion (hereinafter referred to as "pre-curing adhesion") when the two sheets are contacted with one another or shortly thereafter and a second degree of adhesion (hereinafter referred to as "post-curing adhesion") after the adhesive is cured. A preferred type of hardenable adhesive for use in this medium comprises a macromolecular organic binder; a photopolymerizable ethylenically unsaturated monomer having at least one terminal ethylenic group capable of forming a high molecular weight polymer by free radical-initiated, chain-propagated addition polymerization; and a free radical-generating, addition polymerization-initiating system activatable by actinic radiation.

This preferred type of hardenable adhesive gives good results. However, the preferred hardenable adhesive formulations described in the aforementioned application Ser. No. 07/616,853, which comprise a polyfunctional acrylate monomer admixed with a methacrylate copolymer, require a substantial lag time (the period between the lamination of the two sheets and the curing of the hardenable adhesive) to ensure that after curing the two sheets adhere sufficiently to one another. This substantial lag time, which is of the order of tens of minutes, is presumably required because it is necessary for the polyfunctional acrylate monomer to diffuse into an adjacent layer of the imaging medium in order to provide sufficient post-curing adhesion. In some cases, as for example where it is desired to carry out curing of the adhesive "in line" with the lamination (i.e, when the medium is to move continuously at a substantial speed along a production line from the lamination to the curing operations, perhaps via intervening cutting or other stations), the need for a substantial lag time in order to develop post-curing adhesion is disadvantageous since the production line must be modified to provide a long travel for the medium between the lamination station and the curing station, and providing such a long travel will normally involve the provision of numerous extra rollers in the production line, thus increasing the cost, size and power consumption of the line.

It has now been found that, by modifying the adhesive compositions described in the aforementioned application Ser. No. 07/616,853, and International Patent Application No. PCT/US91/08585, the lag time necessary to develop substantial post-curing adhesion can be substantially reduced.

SUMMARY OF THE INVENTION

Accordingly, this invention provides a method of preparing a laminar thermal imaging medium. This method comprises the steps of:

providing a first element comprising a first sheet transparent to image-forming radiation and having at least a surface zone or layer of polymeric material heat-activatable upon subjection of the thermal imaging medium to brief and intense radiation, the first element carrying a layer of porous or particulate image-forming substance having cohesivity in excess of its adhesivity for the polymeric heat-activatable layer, and, on the opposed side of the layer of porous or particulate image-forming substance from the surface zone or layer, a first layer of adhesive;

providing a second element comprising a second sheet carrying a second layer of adhesive;

one of the first and second layers of adhesive comprising a polymeric hardenable adhesive comprising a macromolecular organic binder having amino or substituted amine groups, and a photopolymerizable monomer;

laminating the first and second elements together with the first and second layers of adhesive in contact with one another and with the first and second sheets outermost and forming a unitary laminar medium in which the hardenable adhesive remains in its unhardened condition and serves to reduce the tendency for the unitary laminar medium to delaminate on application of stresses to the medium: and subjecting the unitary laminar medium to actinic radiation effective to cause polymerization of the photopolymerizable monomer, thus hardening the hardenable adhesive into a durable polymeric layer.

This invention also provides a laminar thermal imaging medium, actuatable in response to intense image-forming radiation for production of an image, the laminar medium comprising in order:

a first sheet transparent to the image-forming radiation and having at least a surface zone or layer of polymeric material heat-activatable upon subjection of the thermal imaging medium to brief and intense radiation;

a layer of porous or particulate image-forming substance having cohesivity in excess of its adhesivity for the polymeric heat-activatable layer;

a first layer of adhesive affixed, directly or indirectly, to the layer of porous or particulate image-forming substance;

a second layer of adhesive adhered to the first layer of adhesive; and a second sheet covering the layer of porous or particulate image-forming substance and adhered, via the first and second layers of adhesive, to the layer of image-forming substance, the second sheet, upon separation of the first and second sheets after exposure to the intense radiation, being adapted to the removal therewith of unexposed portions of the image-forming substance;

one of the first and second layers of adhesive comprising a polymeric hardenable adhesive comprising a macromolecular organic binder having amino or substituted amino groups, and a photopolymerizable monomer, the hardenable adhesive layer being capable in its unhardened condition of reducing the tendency for the laminar thermal imaging medium to delaminate on application of physical stresses to the medium and being hardenable to a layer of sufficient hardness to provide a durable base for the image.

This invention extends to this medium in both its uncured and its cured forms.

Finally, this invention provides a photohardenable adhesive composition comprising a mixture of:

a copolymer of at least one dialkylaminoalkyl acrylate or methacrylate with at least one alkyl acrylate or methacrylate;

a di- or higher functional acrylate or methacrylate; and a photoinitiator.

DETAILED DESCRIPTION OF THE INVENTION

Figure 1:
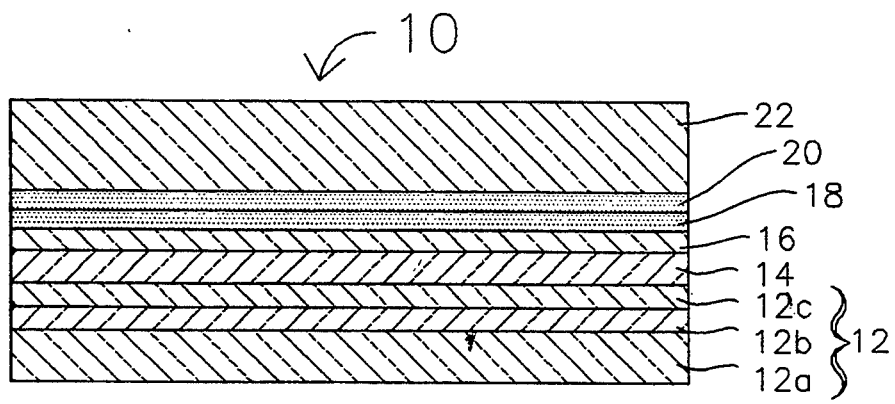
FIG. 1 is a schematic cross-section of a preferred laminar thermally actuatable imaging medium of the present invention.

As already mentioned, the method of the present invention uses a first element comprising a first sheet transparent to image-forming radiation and having a surface zone or layer of polymeric material heat-activatable upon subjection of the thermal imaging medium to brief and intense radiation. The first element also comprises a layer of porous or particulate image-forming substance having cohesivity in excess of its adhesivity for the polymeric heat-activatable layer, and, on the opposed side of the layer of porous or particulate image-forming substance from the surface zone or layer, a first layer of adhesive (hereinafter referred to as the "first adhesive layer"). The present method also uses a second element comprising a second sheet carrying a second layer of adhesive (hereinafter referred to as the "second adhesive layer"). One of the two adhesive layers comprises a polymeric hardenable adhesive comprising a macromolecular organic binder having amino or substituted amino (typically dialkylamino) groups, and a photopolymerizable monomer. The first and second elements are laminated together with the first and second adhesive layers in contact with one another and with the first and second sheets outermost, so forming a unitary laminar medium in which the hardenable adhesive remains in its unhardened condition; this unhardened adhesive layer serves to reduce the tendency for the unitary laminar medium to delaminate on application of stresses to the medium. Later, the medium is subjected to actinic radiation effective to cause polymerization of the photopolymerizable monomer, thus hardening the hardenable adhesive into a durable polymeric layer.

Very desirably, the adhesive layer which does not contain the macromolecular organic binder comprises a polymer having acidic groups, preferably carboxyl groups. It has been found that contact between the one adhesive layer containing a macromolecular organic binder having amino or substituted amino groups and the other adhesive layer containing the polymer having acidic groups enables the lag times required before curing of the hardenable adhesive to be greatly reduced, typically to only about 10 to about 30 seconds, while still providing good post-curing adhesion between the two elements of the imaging medium. In addition, the use of a polymer having acidic groups provides good pre-curing adhesion between the two elements of the imaging medium.

So far as the development of post-curing adhesion is concerned, either of the two adhesive layers may contain the macromolecular organic binder having amino or substituted amino groups. However, for practical reasons it is preferred that this macromolecular organic binder be present in the second adhesive layer of the second element, and that the first adhesive layer of the first element contain the polymer having acidic groups. As explained in the aforementioned application Ser. No. 07/798,899, when hardenable adhesives containing a macromolecular binder and a polymerizable monomer are incorporated into thermal imaging media, the monomer tends to diffuse into other layers of the media and affect the properties of the media. Thus, if such a hardenable adhesive is incorporated into the first element of an imaging medium of the present invention prior to lamination of the first and second elements, polymerizable monomer may diffuse into the other layers of the first element, with adverse effects on the functioning of the final imaging medium. If, on the other hand, the hardenable adhesive is incorporated into the second element of the imaging medium (this second element typically comprises only the second adhesive layer and the second sheet), prior to lamination of the first and second elements the polymerizable monomer cannot diffuse into any other layers where it could affect the performance of the final imaging medium.

The present invention also gives substantial advantages even when the adhesive layer which does not contain the macromolecular organic binder also does not contain acidic groups. In thermal imaging media of the type described in the aforementioned application Ser. Nos. 07/616,853 and 07/798,899, the cured adhesive layer may, depending upon the hardness thereof, fracture or shatter, or separate from the second sheet, on application of stress, as for example where an image formed upon the second sheet is flexed or distorted. Also, in some media of this type, if a single sheet or a pack of sheets of the medium are dropped sharply on one edge, the structure of the imaging medium is disrupted and the imaging performance of the medium is no longer satisfactory. It has been found that the use of first and second adhesive layers, the second of which contains amino or substituted amino groups, in accordance with the present invention, substantially reduces these problems.

The aforementioned application Ser. No. 07/798,899 describes the use, in a thermal imaging medium, of a barrier or diffusion control layer which resists diffusion of the photopolymerizable ethylenically unsaturated monomer therethrough in order to prevent this monomer diffusing into certain other layers of the imaging medium. Such a diffusion control layer can, if desired, be incorporated into the imaging medium of the present invention between the layer of image-forming substance and the first adhesive layer, but in general it is not necessary to provide a separate diffusion control layer (i.e., a diffusion control layer in addition to the first adhesive layer) in the present imaging medium. When the monomer is present in the second adhesive layer, the first adhesive layer will provide some resistance to diffusion of the monomer therethrough (thereby acting as a diffusion control layer), and will thus reduce the tendency for the monomer to reach the layer of image-forming substance, or another layer where its presence might adversely affect the performance of the imaging medium.

Secondly, the present imaging medium will typically be used in a production process in which curing of the hardenable adhesive occurs in line with the lamination step, so that a lag time of only about 10 to about 30 seconds to a few minutes elapses between lamination of the first and second elements and curing of the hardenable adhesive, and there is little time for the monomer to diffuse into layers where its presence might adversely affect the performance of the imaging medium. Finally, when the present imaging medium has a second adhesive layer containing amino or substituted amino groups and a diffusible monomer and a first adhesive layer containing acidic groups, the interactions between the amino and acidic groups following lamination of the first and second elements form a strongly ionic layer at the interface between the first and second adhesive layers, and it is believed that this strongly ionic layer hinders diffusion of the (typically non-ionic) monomer into the first adhesive layer and the other layers of the first element.

In the preferred form of the present imaging medium in which one adhesive layer contains acidic groups, the polymer having acidic groups desirably comprises a copolymer of acrylic or methacrylic acid with at least one acrylate or methacrylate monomer. The macromolecular organic binder having amino or substituted amino groups desirably comprises a polymer having repeating units derived from a dialkylaminoalkyl acrylate or methacrylate, and is preferably a copolymer of at least one dialkylaminoalkyl acrylate or methacrylate with at least one alkyl acrylate or methacrylate. This copolymer desirably has a glass transition temperature in the range of from about $-10°$ to about $+50°$ C., preferably about $-10°$ to about $+30°$ C. An especially preferred group of copolymers of this type comprise from 0 to about 10 parts by weight of butyl acrylate; from about 65 to about 95 parts by weight of butyl methacrylate; and from about 5 to about 25 parts by weight of N,N-dimethylaminoethyl acrylate. A specific preferred copolymer comprises 5 parts by weight of butyl acrylate, 82 parts by weight of butyl methacrylate and 13 parts by weight of N,N-dimethylaminoethyl acrylate.

The photopolymerizable monomer used in the present imaging medium desirably comprises a di- or higher functional acrylate or methacrylate, preferably a tri- or higher functional acrylate or methacrylate, a specific preferred monomer being trimethylolpropane triacrylate.

For optimum performance of the present imaging medium, the properties of both the uncured and cured forms of the hardenable adhesive layer should be carefully chosen. Prior to curing, the hardenable adhesive layer serves to hold the first and second elements of the imaging medium together and to reduce the effects of stress on the medium, while after curing the hardenable adhesive layer affects the mechanical properties of the medium, and after imaging acts as a base on which an image rests. It has been found experimentally that increasing the level of amino or substituted amino groups in the hardenable adhesive not only increases the rapid development of post-curing adhesion (thus reducing the lag time required) but also increases the strength of the cured adhesive, thereby increasing the resistance of an image formed thereon to removal or distortion of the areas of the image containing the porous or particulate image-forming substance; if the cured hardenable adhesive is too soft, mechanical stress, such as that caused by handling of the image, may cause removal of the image-forming substance or distortion of the pels of the image. The resistance of the image to removal or distortion is also affected by the glass transition temperature of the macromolecular organic binder used in the hardenable adhesive and the amount of photopolymerizable monomer used therein; the stiffness of the cured hardenable adhesive tends to increase as the glass transition temperature or the concentration of photopolymerizable monomer increases. However, care should be taken not to increase the stiffness of the cured hardenable adhesive too far, since an excessively stiff cured hardenable adhesive may increase the susceptibility of the imaging medium to the aforementioned shattering problem.

Figure 2:
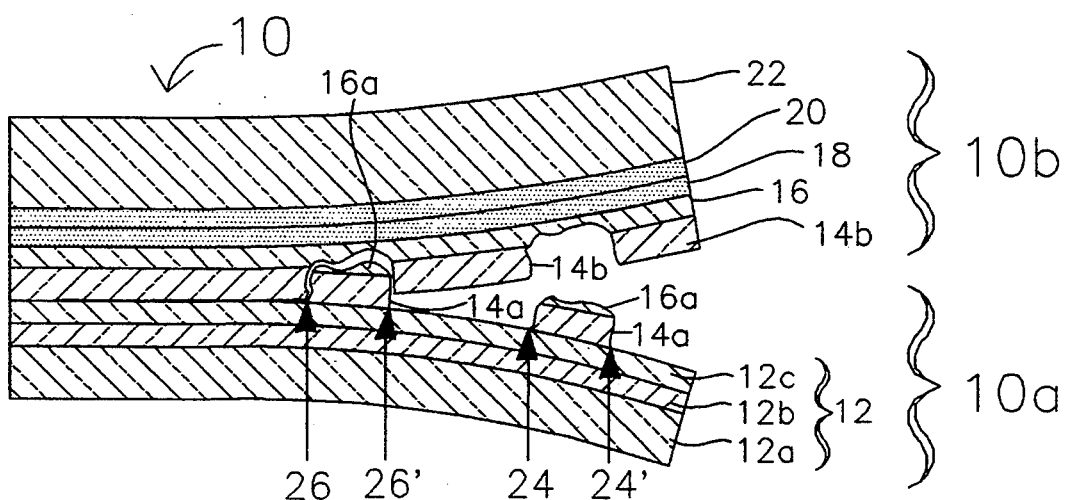
FIG. 2 is a schematic cross-section similar to FIG. 1 but showing the medium in a state of partial separation after thermal imaging.

In FIG. 1, there is shown, a preferred laminar imaging medium (generally designated 10) of the present invention suited to production of a pair of high resolution images, shown in FIG. 2 as images 10a and 10b in a partial state of separation. Thermal imaging medium 10 includes a first element in the form of a first sheet-like or web material 12 (comprising sheet material 12a, stress-absorbing layer 12b and heat-activatable zone or layer 12c) having superposed thereon, and in order, porous or particulate image-forming layer 14, release layer 16, first adhesive layer 18, second, hardenable polymeric adhesive layer 20 and second sheet-like or web material 22.

Upon exposure of the medium 10 to infra-red radiation, exposed portions of image-forming layer 14 are more firmly attached to web material 12, so that, upon separation of the respective sheet-like materials, as shown in FIG. 2, a pair of images, 10a and 10b, is provided. The nature of certain of the layers of preferred thermal imaging medium material 10 and their properties are importantly related to the manner in which the respective images are formed and partitioned from the medium after exposure. The functioning of hardenable adhesive layer 20 is important to the reduction of undesired delamination at the interface between heat-activatable zone or layer 12c and porous or particulate image-forming layer 14 of the preferred thermal imaging medium shown in FIG. 1. The various layers of medium material 10 are described in detail hereinafter.

Web material 12 comprises a transparent material through which imaging medium 10 can be exposed to radiation. Web material 12 can comprise any of a variety of sheet-like materials, although polymeric sheet materials will be especially preferred. Among preferred sheet materials are polystyrene, poly(ethylene terephthalate), polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile). An especially preferred sheet material from the standpoints of durability, dimensional stability and handling characteristics is poly(ethylene terephthalate), commercially available, for example, under the tradename Mylar, of E. I. du Pont de Nemours & Co., Wilmington Del., or under the tradename Kodel, of Eastman Kodak Company, Rochester, N.Y.

The stress-absorbing layer 12b is as described in copending application U.S. Ser. No. 07/616,854 (now U.S. Pat. No. 5,200,297) and the corresponding International Patent Application No. PCT/US91/08604 (Publication No. WO 92/09443), and comprises a polymeric layer capable of absorbing physical stresses applied to the imaging medium 10. The stress-absorbing layer 12b provides added protection against delamination of the medium 10 when rigorous physical stresses are applied thereto, and is desirably formed from a compressible or elongatable polyurethane. The stress-absorbing layer 12b is optional and may sometimes be omitted, depending upon the second adhesive layer 20 used and the stresses to which the medium 10 will be subjected.

Heat-activatable zone or layer 12c provides an essential function in the imaging of medium 10 and comprises a polymeric material which is heat activatable upon subjection of the medium to brief and intense radiation, so that, upon rapid cooling, exposed portions of the surface zone or layer 12c are firmly attached to porous or particulate image-forming layer 14. If desired, when the stress-absorbing layer 12b is omitted, surface zone 12c can be a surface portion or region of web material 12, in which case, layers 12a and 12c will be of the same or similar chemical composition. In general, it is preferred that layer 12c comprise a discrete polymeric surface layer on sheet material 12a or stress-absorbing layer 12b. Layer 12c desirably comprises a polymeric material having a softening temperature lower than that of sheet material 12a, so that exposed portions of image-forming layer 14 can be firmly attached to web material 12. A variety of polymeric materials can be used for this purpose, including polystyrene, poly(styrene-co-acrylonitrile), poly(vinyl butyrate), poly(methyl methacrylate), polyethylene and poly(vinyl chloride).

The employment of a thin heat-activatable layer 12c on a substantially thicker and durable sheet material 12a permits desired handling of the web material and desired imaging efficiency. The use of a thin heat-activatable layer 12c facilitates the concentration of heat energy at or near the interface between layers 12c and image-forming layer 14 and permits optimal imaging effects and reduced energy requirements. It will be appreciated that the sensitivity of layer 12c to heat activation (or softening) and attachment or adhesion to layer 14 will depend upon the nature and thermal characteristics of layer 12c and upon the thickness thereof.

Stress-absorbing layer 12b can be provided on sheet material 12a by the methods described in the aforementioned copending application Ser. No. 07/616,854 and International Patent Application No. PCT/US91/08604. Heat-activatable layer 12c can be provided by resort to known coating methods. For example, a layer of poly(styrene-co-acrylonitrile) can be applied to a web of poly(ethylene terephthalate) by coating from an organic solvent such as methylene chloride. In general, the desired handling properties of web material 12 will be influenced by the nature of sheet material 12a itself, inasmuch as layers 12b and 12c will be coated thereon as thin layers. The thickness of web material 12 will depend upon the desired handling characteristics of medium 10 during manufacture and during imaging and any post-imaging steps. Thickness will also be dictated in part by the intended use of the image to be carried thereon and by exposure conditions, such as the wavelength and power of the exposing source. Typically, web material 12 will vary in thickness from about 0.5 to 7 mil (about 13 to 178 $\mu$m). Good results are obtained using, for example, a sheet material 12a having a thickness of about 1.5 to 1.75 mils (38 to 44 $\mu$m). Stress-absorbing layer 12b will typically have a thickness in the range of about 1 to 4 $\mu$m, while layer 12c will typically be a layer of poly(styrene-co-acrylonitrile) having a thickness of about 0.1 to 5 $\mu$m.

Heat-activatable layer 12c can include additives or agents providing known beneficial properties. Adhesiveness-imparting agents, plasticizers, adhesion-reducing agents, or other agents can be used. Such agents can be used, for example, to control adhesion between layers 12c and 14, so that undesired separation at the interface thereof is minimized during manufacture of laminar medium 10 or during use thereof in a thermal imaging method or apparatus. Such control also permits the medium, after imaging and separation of sheet-like web materials 12 and 22, to be partitioned in the manner shown in FIG. 2.

Image-forming layer 14 comprises an image-forming substance deposited onto heat-activatable zone or layer 12c as a porous or particulate layer or coating. Layer 14, also referred to as a colorant/binder layer, can be formed from a colorant material dispersed in a suitable binder, the colorant being a pigment or dye of any desired color, and preferably being substantially inert to the elevated temperatures required for thermal imaging of medium 10. Carbon black is a particularly advantageous and preferred pigment material. Preferably, the carbon black material will comprise particles having an average diameter of about 0.01 to 10 μm. Although the description herein will refer principally to carbon black, other optically dense substances, such as graphite, phthalocyanine pigments and other colored pigments can be used. If desired, substances which change their optical density upon subjection to temperatures as herein described can also be employed.

The binder for the image-forming substance or layer 14 provides a matrix to form the porous or particulate substance thereof into a cohesive layer and serves to adhere layer 14 to heat-activatable zone or layer 12c. In general, it will be desired that image-forming layer 14 be adhered to surface zone or layer 12c sufficiently to prevent accidental dislocation either during the manufacture of medium 10 or during the use thereof. Layer 14 should, however, be separable (in non-exposed regions) from zone or layer 12c, after imaging and separation of webs 12 and 22, so that partitioning of layer 14 can be accomplished in the manner shown in FIG. 2.

Image-forming layer 14 can be conveniently deposited onto surface zone or layer 12c, using any of a number of known coating methods. According to a one embodiment, and for ease in coating layer 14 onto zone or layer 12c, carbon black particles are initially suspended in an inert liquid vehicle, with a binder or dispersant, and the resulting suspension or dispersion is uniformly spread over heat-activatable zone or layer 12c. On drying, layer 14 is adhered as a uniform image-forming layer on the surface thereof. It will be appreciated that the spreading characteristics of the suspension can be improved by including a surfactant, such as ammonium perfluoroalkyl sulfonate, nonionic ethoxylate or the like. Other substances, such as emulsifiers, can be used or added to improve the uniformity of distribution of the carbon black in its suspended state and, thereafter, in its spread and dry state. Layer 14 can range in thickness and typically will have a thickness of about 0.1 to about 10 μm. In general, it is preferred from the standpoint of image resolution, that a thin layer 14 be employed. Layer 14 should, however, be of sufficient thickness to provide desired and predetermined optical density in the images prepared from imaging medium 10.

Suitable binder materials for image-forming layer 14 include gelatin, poly(vinyl alcohol), hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferable, the ratio of pigment to binder will be in the range of from about 4:1 to about 10:1. A preferred binder material for a carbon black pigment material is poly(vinyl alcohol).

If desired, additional additives or agents can be incorporated into image-forming layer 14. Thus, submicroscopic particles, such as chitin, polytetrafluoroethylene particles and/or polyamide can be added to colorant/binder layer 14 to improve abrasion resistance. Such particles can be present, for example, in amounts of from about 1:2 to about 1:20, particles to layer solids, by weight.

For the production of images of high resolution, it will be essential that image-forming layer 14 comprise materials that permit fracture through the thickness of the layer and along a direction substantially orthogonal to the interface between surface zone or layer 12c and image-forming layer 14, i.e., substantially along the direction of arrows 24, 24', 26, and 26', shown in FIG. 2. It will be appreciated that, in order for images 10a and 10b to be partitioned in the manner shown in FIG. 2, image-forming layer 14 will be orthogonally fracturable as described above and will have a degree of cohesivity in excess of its adhesivity for: heat-activatable zone or layer 12c. Thus, on separation of webs 12 and 22 after imaging, layer 14 will separate in non-exposed areas from heat-activatable layer 12c and remain in exposed areas as porous or particulate portions 14a on web 12. Layer 14 is an imagewise disruptible layer owing to the porous or particulate nature thereof and the capacity for the layer to fracture or break sharply at particle interfaces.

The release layer 16 shown in FIG. 1 is included in thermal imaging medium 10 to facilitate separation of images 10a and 10b according to the mode shown in FIG. 2. As described hereinbefore, regions of medium 10 subjected to radiation become more firmly secured to heat-activatable zone or layer 12c by reason of the heat activation of the layer by the exposing radiation. Non-exposed regions of layer 14 remain only weakly adhered to heat-activatable zone or layer 12c and are carried along with sheet 22 on separation of sheets 12 and 22. This is accomplished by the adhesion of layer 14 to heat-activatable zone or layer 12c, in non-exposed regions, being less than: (a) the adhesion between layers 14 and 16; (b) the adhesion between layers 16 and 18; (c) the adhesion between layers 18 and 20; (d) the adhesion between layer 20 and sheet 22; and (e) the cohesivity of layers 14, 16, 18 and 20. The adhesion of sheet 22 to porous or particulate layer 14, through layers 16, 18 and 20, while sufficient to remove non-exposed regions of porous and particulate layer 14 from heat-activatable zone or layer 12c, is controlled, in exposed areas, by release layer 16 so as to prevent removal of firmly attached exposed portions 14a of layer 14 (attached to heat-activated zone or layer 12c by exposure thereof).

Release layer 16 is designed such that its cohesivity and its adhesion to either first adhesive layer 18 or porous or particulate layer 14 is less, in exposed regions, than the adhesion of layer 14 to heat-activated zone or layer 12c. The result of these relationships is that release layer 16 undergoes an adhesive failure in exposed areas at the interface between layers 16 and 18, or at the interface between layers 14 and 16; or, as shown in FIG.

2, a cohesive failure of layer 16 occurs, such that portions (16b) are present in image 10b and portions (16a) are adhered in exposed regions to porous or particulate portions 14a. Portions 16a of release layer 16 serve to provide surface protection for the image areas of image 10a against abrasion and wear.

Release layer 16 can comprise a wax, wax-like or resinous material. Microcrystalline waxes, for example, high density polyethylene waxes available as aqueous dispersions, can be used for this purpose. Other suitable materials include carnauba, beeswax, paraffin wax and wax-like materials such as poly(vinyl stearate), poly(ethylene sebacate), sucrose polyesters, polyalkylene oxides and dimethylglycol phthalate. Polymeric or resinous materials such as poly(methyl methacrylate) and copolymers of methyl methacrylate and monomers copolymerizable therewith can be employed. If desired, hydrophilic colloid materials, such as poly(vinyl alcohol), gelatin or hydroxyethyl cellulose can be included as polymer binding agents.

Resinous materials, typically coated as latices, can be used and latices of poly(methyl methacrylate) are especially useful. Cohesivity of layer 16 can be controlled so as to provide the desired and predetermined fracturing. Waxy or resinous layers which are disruptible and which can be fractured sharply at the interfaces of particles thereof can be added to the layer to reduce cohesivity. Examples of such particulate materials include, silica, clay particles and particles of polytetrafluoroethylene.

The first adhesive layer 18 comprises a polymer having acidic groups thereon, preferably carboxyl groups. As discussed above, on contact with the second adhesive layer 20 (discussed in detail below), first adhesive layer 18 serves to develop rapidly substantial pre-curing and post-curing adhesion to the second adhesive layer 20, thereby securing the first and second elements together to form the unitary laminar imaging medium 10. A specific preferred copolymer for use in layer 18 is that available as Neocryl BT 520 from ICI Resins (U.S.), Wilmington Mass. 01887-0677. This material is an acrylic copolymer containing a sufficient percentage of free carboxyl groups to permit solubility in water that contains ammonia.

The second adhesive layer 20 of imaging medium 10 comprises a hardenable adhesive layer which is capable of protecting the medium against stresses that would create a delamination of the medium, typically at the interface between zone or layer 12c and image-forming layer 14. The physical stresses which tend to promote delamination and which can be alleviated by hardenable layer 20 can vary and include stresses created by bending the laminas medium and stresses created by winding, unwinding, cutting, slitting or stamping operations. Since hardenable layer 20 can vary in composition, it will be appreciated that a particular adhesive may, for example, provide protection of the medium against delamination promoted by bending of the medium, while providing little or no protection against delamination caused, for example, by a slitting or stamping-and-cutting operation, or vice versa.

As already mentioned, imaging medium 10 is normally prepared by the lamination of first and second sheet-like web elements or components, the first element or component comprising web material 12 carrying image-forming layer 14, release layer 16 and first adhesive layer 18, while the second element comprises second adhesive layer 20 and second web material 22. The two elements can be laminated under pressure, and optionally under heating conditions, to provide the unitary and laminar thermally actuatable imaging medium 10 of the invention.

The imaging medium 10 may be subjected to a variety of handling and/or cutting procedures before and/or after curing of the second adhesive layer 20. The lamination of the first and second elements is typically conducted on endless webs of the two elements. Following this lamination of endless webs, individual sheets of predetermined size suited, for example, to stacking in a cassette for feeding into a printer apparatus can be prepared from the endless web by die cutting or similar methods. Because of the high shear stresses involved in die cutting, such die cutting will typically be performed before curing of the second adhesive layer 20, so that the uncured adhesive layer 20 can serve to eliminate or minimize delamination of the medium 10 caused by the shear stresses to which the medium 10 is exposed during die cutting.

While applicants do not wish to be bound by any particular theory or mechanism in explanation of the manner in which the second adhesive layer 20 serves to minimize stress-induced delamination of the medium material, it is believed that this layer 20 may serve to absorb physical stresses applied to medium and thereby reduce the incidence of delamination. Alternatively, layer 18 may serve to distribute stresses throughout the layer or otherwise prevent applied stresses from being transmitted through the medium and from causing delamination.

Alternatively, the second adhesive layer 20 may first be cured and thereafter be subjected to cutting operations. Such post-curing cutting is best effected by techniques, such as slitting, which do not place great stress upon the medium. For example, the medium 10 could be laminated and cured in-line and thereafter subjected to slitting to trim the edges of the medium before the cured medium is wound onto a roll.

As already mentioned, the medium of the present invention has the important advantage that only a short lag time, typically about 10 to about 30 seconds, is required between lamination of the two elements of the imaging medium and curing in order to develop strong post-curing adhesion. Accordingly, curing of the medium can conveniently be effected in line without the need to provide a very long travel for the medium between the lamination station and the curing station. On the other hand, the medium of the present invention can be formulated to permit a long lag time between lamination of the two elements and curing of the hardenable adhesive layer, without adverse effects on the performance of the final, cured medium. Preferred imaging media of the invention have been found experimentally to endure lag times of about 18 hours without adverse effects. Long lag times are advantageous in case it is necessary to halt the line for several hours because of, for example, mechanical or electrical failure, since the long lag time avoids the need to scrap material already laminated, but not cured, when the line is halted, and also simplifies bringing the line back into operation. Such long lag times are also advantageous if it is desired to effect curing of the medium off line, since the long lag times allow for considerable delays before the curing must be effected.

Cutting of the present imaging medium can be effected before or after curing; in some cases, the choice between pre-curing and post-curing cutting will be determined by the cutting technique employed. If it is desired to cut before curing, such cutting can be performed either in-line with lamination and curing, or off line. The long lag times achievable with the present imaging medium facilitate off line pre-curing cutting, since considerable delays can be tolerated between lamination and cutting, or between cutting and curing, without adverse effects on the properties of the final cured medium.

Preferred macromolecular binders for use in the second adhesive layer 20 have already been discussed above. Suitable photopolymerizable ethylenically unsaturated monomers for such compositions include the di-, tri and higher functional acrylates, such as the aforementioned acrylate and methacrylate esters of polyhydric alcohols (e.g., pentaerythritol triacrylate and trimethylolpropane triacrylate, the latter being the especially preferred monomer for use in the present method and imaging medium). Other suitable monomers include ethylene glycol diacrylate or dimethacrylate or mixtures thereof; glycerol diacrylate or triacrylate; urethane acrylates; and epoxy acrylates. In general, photopolymerizable monomers which provide tack in such compositions or which serve to plasticize the macromolecular binder will be preferred.

Those skilled in the art of photopolymerization will be aware that most photopolymerizable monomers require the presence of a photoinitiator for polymerization (curing) of the monomer to occur, and thus typically the second adhesive layer 20 will comprise such a photoinitiator. The photoinitiators and concentrations thereof required with various photopolymerizable monomers are well known to those skilled in the art, and the conventional types and concentrations of photoinitiators can be used in the second adhesive layer 20. Thus, the specific preferred photopolymerizable monomer trimethylolpropane triacrylate requires the presence of a free-radical generating photoinitiator, for example that sold commercially under the tradename Irgacure 651 by Ciba-Geigy. To prevent premature curing of the hardenable adhesive, it may be desirable to include a small amount of a free radical inhibitor, for example a phenol.

In general, second adhesive layer 20 can be coated as a low viscosity solution and then dried to a highly viscous coating. Anti-oxidants can be included, if desired. Thickeners, binders and coating aids can be included to control viscosity and facilitate coating to a uniform and adhesive layer. Tack-promoting and plasticizing agents can be included for their known properties.

Photohardening of second adhesive layer 20 can be accomplished in known manner by polymerization, using conventional sources of ultraviolet radiation such as carbon arc lamps, commercially available ultra-violet electrodeless bulbs (for example, "D" and "H" bulbs sold by Fusion UV Curing Systems, 7600 Standish Place, Rockville Md. 20855-2798), xenon lamps and medium pressure mercury lamps. The choice of a suitable irradiating source for hardening will also depend on the thickness of the layer to be hardened.

The thickness of the second adhesive layer can vary and, in general, will be in the range of from 0.1 to 50 μm. A preferred range of thickness is from 0.5 to 20 μm.

As is known in the art, photopolymerization systems are oftentimes sensitive to atmospheric oxygen. The use of photopolymerizable compositions as described above and which are sensitive to oxygen can be used to advantage. Individually cut units of medium 10 tend, at the edge regions of second adhesive layer 20 about the perimeter of the laminar medium, to be incompletely polymerized and to retain a degree of softness which reduces the tendency for the medium to delaminate.

The use of hardenable second adhesive layer 20 in medium 10 is advantageous from the standpoint of permitting lamination of the components thereof without the requirement of elevated temperatures that may have an adverse influence on other layers or components of the medium. While heat and pressure can be used to effect the lamination, pressing of the components without heat can be used to provide the lamination. The use of a hardenable layer 20 that can be cured under ambient room conditions reduces the required dwell time to achieve lamination and increases manufacturing efficiency.

Upon curing of second adhesive layer 20, medium material 10 is ready for imaging. Attachment of weakly adherent image-forming layer 14 to heat-activatable zone or layer 12c in areas of exposure is accomplished by (a) absorption of radiation within the imaging medium; (b) conversion of the radiation to heat sufficient in intensity to heat activate zone or layer 12c; and (c) cooling to more firmly join exposed regions or portions of layer 14 to heat-activatable zone or layer 12c. Thermal imaging medium 10 is capable of absorbing radiation at or near the interface of layer 14 with heat-activatable zone or layer 12c. This is accomplished by using layers in medium 10 which by their nature absorb radiation and generate the requisite heat for desired thermal imaging, or by including, in at least one of the layers, an agent capable of absorbing radiation of the wavelength of the exposing source. Infrared-absorbing dyes can, for example, be suitably employed for this purpose.

If desired, porous or particulate image-forming substance 14 can comprise a pigment or other colorant material such as carbon black which, as is more completely described hereinafter, is absorptive of exposing radiation and which is known in the thermographic imaging field as a radiation-absorbing pigment. Inasmuch as a secure bonding or joining is desired at the interface of layer 14 and heat-activatable zone or layer 12c, it may be preferred in some instances that a radiation-absorbing substance be incorporated into either or both of image-forming layer 14 and heat-activatable zone or layer 12c.

Suitable radiation-absorbing substances in layers 14 and/or 12c, for converting radiation into heat, include carbon black, graphite or finely divided pigments such as the sulfides or oxides of silver, bismuth or nickel. Dyes such as the azo dyes, xanthene dyes, phthalocyanine dyes or anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issued Apr. 2, 1985 to D. J. Gravesteijn, et al.), and including 1,3-bis[2,6-di-t-butyl-4H-thiopyran-4-ylidene)methyl]-2,4-dihydroxy-dihydroxide-cyclobutene diylium-bis{inner salt}. Other suitable infrared-absorbing dyes include those described in copending application U.S. Ser. No. 07/696,222 (now U.S. Pat. No. 5,231,190) (and in the corresponding European Application No. 92107574.3, Publication No. 516,985);

in copending application U.S. Ser. No. 07/795,038 filed Nov. 20, 1991 by Stephen J. Telfer et al. (and in the corresponding International Application No. PCT/US91/08695, Publication No. WO 92/09661); in copending application U.S. Ser. No. 07/795,034 (now U.S. Pat. No. 5,227,498), and in copending application U.S. Ser. No. 07/795,341 (now U.S. Pat. No. 5,227,499).

Thermal imaging medium 10 can be imaged by creating (in medium 10) a thermal pattern according to the information imaged. Exposure sources capable of providing radiation which can be directed onto medium 10, and which can be converted by absorption into thermal energy, can be used. Gas discharge lamps, xenon lamps and lasers are examples of such sources.

The exposure of medium 10 to radiation can be progressive or intermittent. For example, a medium as shown in FIG. 1 can be fastened onto a rotating drum for exposure of the medium through sheet 12. A radiation spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in an imagewise and predetermined manner to thereby record information according to an original to be imaged. As is shown in FIG. 2, a pattern of intense radiation can be directed onto medium 10 by exposure to a laser from the direction of the arrows 24, 24', 26 and 26', the areas between the respective pairs of arrows defining regions of exposure.

If desired, an imaging medium of the invention can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers is used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as fine as 4,000–10,000 dots per inch (160–400 dots per millimeter).

Locally applied heat, developed at or near the interface of image-forming layer 14 and heat-activatable zone or layer 12c can be intense (about 400° C.) and serves to effect imaging in the manner described above. Typically, the laser dwell time on each pixel will be less than one millisecond, and the temperature in exposed regions can be between about 100° C. and about 1000° C.

Apparatus and methodology for forming images from thermally actuatable media such as the medium of the present invention are described in detail in copending application U.S. Ser. No. 07/616,658 (now U.S. Pat. No. 5,170,261) (and the corresponding International Application No. PCT/US91/06880, Publication No. WO 92/10053); and in copending application U.S. Ser. No. 07/616,786, (now U.S. Pat. No. 5,221,971) (and the corresponding International Application No. PCT/US91/06892, Publication No. WO 92/10057).

The imagewise exposure of medium 10 to radiation creates in the medium latent images which are viewable upon separation of the sheets thereof (12 and 22) as shown in FIG. 2. Sheet 22 can comprise any of a variety of plastic materials transmissive of actinic radiation used for the photohardening of photohardenable adhesive layer 20. A transparent polyester (e.g., poly(ethylene terephthalate)) sheet material is preferred. In addition, sheet 22 will preferably be subcoated, or may be corona treated, to promote the adhesion thereto of photohardened and durable layer 20. Preferably, each of sheets 12 and 22 will be flexible polymeric sheets.

The thermal imaging medium of the invention is especially suited to the production of hardcopy images produced by medical imaging equipment such as X-ray equipment, CAT scan equipment, MR equipment, ultrasound equipment and so forth. As is stated in Neblette's Handbook of Photography and Reprography, Seventh Edition, Edited by John M. Sturge, Van Nostrand and Reinhold Company, at pp. 558–559: "The most important sensitometric difference between X-ray films and films for general photography is the contrast. X-ray films are designed to produce high contrast because the density, differences of the subject are usually low and increasing these differences in the radiograph adds to its diagnostic value . . . Radiographs ordinarily contain densities ranging from 0.5 to over 3.0 and are most effectively examined on an illuminator with adjustable light intensity . . . Unless applied to a very limited density range the printing of radiographs on photographic paper is ineffective because of the narrow range of density scale of papers." The medium of the present invention can be used to advantage in the production of medical images using printing apparatus, as described in the aforementioned U.S. application Ser. No. 07/616,658, which is capable of providing a large number of gray scale levels.

The use of a high number of gray scale levels is most advantageous at high densities inasmuch as human vision is most sensitive to gray scale changes which occur at high density. Specifically, the human visual system is sensitive to relative change in luminance as a function of dL/L where dL is the change in luminance and L is the average luminance. Thus, when the density is high, i.e., L is small, the sensitivity is high for a given dL whereas if the density is low, i.e., L is large, then the sensitivity is low for a given dL. In accordance with this, the medium of the present invention is especially suited to utilization with equipment capable of providing small steps between gray scale levels at the high end of the gray scale, i.e., in the high contrast region of greatest value in diagnostic imaging. Further, it is desirable that the high density regions of the gray scale spectrum be rendered as accurately as possible, inasmuch as the eye is more sensitive to errors which occur in that region of the spectrum.

The medium of the present invention is especially suited to the production of high density images as image 10b, shown in FIG. 2. It has been noted previously that separation of sheets 12 and 22 without exposure, i.e., in an unprinted state, provides a totally dense image in colorant material on sheet 22 (image 10b). The making of a copy entails the use of radiation to cause the image-forming colorant material to be firmly attached to web 12. Then, when sheets 12 and 22 are separated, the exposed regions will adhere to web 12 while unexposed regions will be carried to sheet 22 and provide the desired high density image 10b. Since the high density image provided on sheet 22 is the result of "writing" on sheet 12 with a laser to firmly anchor to sheet 12 (and prevent removal to sheet 22) those portions of the colorant material which are unwanted in image 10b, it will be seen that the amount of laser actuation required to produce a high density image can be kept to a minimum. A method for providing a thermal image while keeping exposure to a minimum is disclosed and claimed in the copending application U.S. Ser. No. 07/616,406. filed Nov. 21, 1990 and the corresponding International Application No. PCT/US91/06898, Publication No. WO 92/09939.

If medium 10 were to be exposed in a manner to provide a high density image on sheet 12, it will be appreciated that the high density gray scale levels would be written on sheet 12 with a single laser at an inefficient scanning speed or by the interaction of a number of lasers, increasing the opportunity for tracking error. Because medical images are darker than picture photographs and tracking errors are more readily detected in the high density portion of gray scale levels, a printing apparatus, using medium 10, would need to be complex and expensive to achieve a comparable level of accuracy in the production of a high density medical image on sheet 12 as can be achieved by exposing the medium for production of the high density image on sheet 22.

Since image 10b, by reason of its informational content, aesthetics or otherwise, will oftentimes be considered the principal image of the pair of images formed from medium 10, it may be desired that the thickness of sheet 22 be considerably greater, and the sheet 22 thus more durable, than sheet 12. In addition, it will normally be beneficial from the standpoints of exposure and energy requirements that sheet 12, through which exposure is effected, be thinner than sheet 22. Asymmetry in sheet thickness may increase the tendency of the medium material to delaminate during manufacturing or handling operations. Utilization of photohardenable adhesive layer 20 will be preferred in medium 10 particularly to prevent delamination during manufacture of the medium.

If desired, further protection for the image 10b against abrasion and added durability can be achieved by including an additional layer (not shown) of a thermoplastic material between image-forming layer 14 and surface zone or layer 12c, which additional layer comprises a polymeric layer fracturable substantially along the exposure direction and which provides surface protective portions (over image portions 14b) for improved durability of image 10b. A laminar thermal imaging medium including a thermoplastic intermediate layer to provide surface protection of an image prepared therefrom is disclosed and claimed in the copending application U.S. Ser. No. 07/616,982 (now U.S. Pat. No. 5,155,003), and the corresponding International Application No. PCT/US91/08601, Publication No. WO 92/09442.

Alternatively, additional durability can be provided to image 10b by depositing a protective polymeric overcoat layer thereon. A protected image and method therefor are disclosed and claimed in copending application U.S. Ser. No. 616,851, filed Nov. 21, 1990, and the corresponding International Application No. PCT/US91/08345, Publication No. WO 92/09930.

The following Example is now given, though by way of illustration only, to show details of particularly preferred reagents, conditions and techniques used in the method and imaging medium of the present invention. All parts, ratios and proportions, except where otherwise indicated, are by weight.

EXAMPLE

Onto a first sheet of poly(ethylene terephthalate) of 1.75 mil (44 $\mu$m) thickness (ICI Type 3284 film, available from ICI Americas, Inc., Hopewell, Va.) were deposited the following layers in succession:

a 2.4 $\mu$m thick stress-absorbing layer of polyurethane (a mixture of 90% ICI Neotac R-9619 and 10% ICI NeoRez R-9637, both from ICI Resins (U.S.), Wilmington, Mass.);

a 1.3 $\mu$m thick heat-activatable layer of poly(styrene-co-acrylonitrile);

a 1 $\mu$m thick layer of carbon black pigment, poly(vinyl alcohol) (PVA), 1,4-butanediol diglycidyl ether, and a fluorochemical surfactant (FC-171, available from Minnesota Mining and Manufacturing Corporation, St, Paul, Minn. 55144-1000) at ratios, respectively, of 5:1:0.18/0.005;

a 0.6 $\mu$m thick release layer comprising polytetrafluoroethylene, silica and hydroxyethylcellulose (Natrosol +330, available from Aqualon Incorporated, Bath, Pa. 18014), at ratios, respectively, of 0.5:1:0.1; and a 2.2 $\mu$m thick layer of the aforementioned Neocryl BT 520 copolymer containing acidic groups.

To form the second adhesive layer, 5 parts of butyl acrylate, 82 parts of butyl methacrylate and 13 parts by weight of N,N-dimethylaminoethyl acrylate were copolymerized with 2,2'-azobis(2-methylpropanenitrile) to form a copolymer having a number average molecular weight of about 40,000 and a glass transition temperature of +11° C. A coating solution was prepared comprising 11.90 parts of this copolymer, 2.82 parts of trimethylolpropane triacrylate (TMPTA, available as Ageflex TMPTA from CPS Chemical Company, Old Bridge, N.J. 08857), 0.007 parts of 4-methoxyphenol (a free radical inhibitor), 1.14 parts of 2,2-dimethoxy-2-phenylacetophenone (a photoinitiator, available as Irgacure 651 from Ciba-Geigy Corporation), 0.037 parts of tetrakis{methylene(3,5-di-tert-butyl-4-hydroxyhydrocinnamate)}methane (an anti-oxidant, available as Irganox 1010 from Ciba-Geigy Corporation), 0.037 parts of thiodiethylene bis-(3,5-di-tert-butyl-4-hydroxy)hydrocinnamate (an anti-oxidant, available as Irganox 1035 from Ciba-Geigy Corporation), and 58.28 parts of ethyl acetate solvent. This coating solution was coated onto 4 mil (101 $\mu$m) poly(ethylene terephthalate) film (ICI Type 526 antistatic treated film, available from ICI Americas, Inc., Hopewell, Va.; this film forms the second web 22 of the imaging medium 10) and dried in an oven at about 85° C. (185° F.) to a coating weight of about 9400 mg/m$^2$ to form a hardenable second adhesive layer 20 approximately 10 $\mu$m thick.

The first and second poly(ethylene terephthalate) sheets were immediately brought together with their adhesive layers in face-to-face contact, the 4 mil sheet being in contact with a rotating steel drum. A rubber roll having a Durometer hardness of 70-80 was pressed against the 1.75 mil sheet. The resulting web of laminar medium was then passed in line, approximately 30 seconds after lamination, under a radio-frequency-powered source of ultraviolet radiation, with the 4 mil sheet facing, and at a distance of about 2.5 inches (6.4 cm) from, the source (a Model DRS-111 Deco Ray Conveyorized Ultraviolet Curing System, sold by the aforementioned Fusion UV Curing Systems), which served to cure the second adhesive layer 20.

After curing, the web of imaging medium was passed through a slitting station where edgewise trimming along both edges of the medium was performed in the machine direction. The resultant trimmed web was then wound onto a take-up roll.

Individual sheets of imaging medium cut from the resultant roll were imaged by laser exposure through the 1.75 mil sheet using high intensity semiconductor lasers. In each case, the medium was fixed (clamped) to a rotary drum with the 4 mil sheet facing the drum. The radiation of semiconductor lasers was directed through the 1.75 mil sheet in an imagewise manner in response to a digital representation of an original image to be recorded in the medium. After exposure to the high-intensity radiation (by scanning of the imaging medium orthogonally to the direction of drum rotation) and removal of the exposed imaging medium from the drum, the two sheets of the imaging medium were separated to provide a first image on the first, 1.75 mil sheet and a second (and complementary) image on the second, 4 mil sheet (the principal image).

We claim:

1. A method of preparing a laminar thermal imaging medium which comprises the steps of:
   providing a first element comprising a first sheet transparent to image-forming radiation and having at least a surface zone or layer of polymeric material heat-activatable upon subjection of the thermal imaging medium to brief and intense radiation, the first element carrying a layer of porous or particulate image-forming substance having cohesivity in excess of its adhesivity for the polymeric heat-activatable layer, and, on the opposed side of the layer of porous or particulate image-forming substance from the surface zone or layer, a first layer of adhesive;
   providing a second element comprising a second sheet carrying a second layer of adhesive:
   one of the first and second layers of adhesive comprising a polymeric hardenable adhesive comprising a macromolecular organic binder having amino or substituted amino groups, and a photopolymerizable monomer;
   laminating the first and second elements together with the first and second layers of adhesive in contact with one another and with the first and second sheets outermost and forming a unitary laminar medium in which the hardenable adhesive remains in its unhardened condition and serves to reduce the tendency for the unitary laminar medium to delaminate on application of stresses to the medium; and
   subjecting the unitary laminar medium to actinic radiation effective to cause polymerization of the photopolymerizable monomer, thus hardening the hardenable adhesive into a durable polymeric layer, and forming said thermal imaging medium,
   said thermal imaging medium being capable of absorbing said image-forming radiation at or near the interface of said surface zone or layer with said layer of porous or particulate image-forming substance, converting the absorbed radiation into heat sufficient in intensity to heat activate said surface zone or layer, such that upon cooling exposed portions of said layer of porous or particulate image-forming substance are more firmly attached to said first sheet,
   said thermal imaging medium being adapted to image formation by imagewise exposure of portions of said thermal imaging medium to said image-forming radiation of sufficient intensity to attach exposed portions or said layer of porous or particulate image-forming substance firmly to said first sheet, and by removal to said second sheet, upon separation of said first and second sheets after said imagewise exposure, of unexposed portions of said layer of porous or particulate image-forming substance, thereby to provide first and second images, respectively, on said first and second sheets.

2. A method according to claim 1 wherein the other one of the first and second layers of adhesive comprises a polymer having acidic groups.

3. A method according to claim 2 wherein the acid groups are carboxyl groups.

4. A method according to claim 2 wherein the second layer of adhesive comprises the polymeric hardenable adhesive comprising a macromolecular organic binder having amino or substituted amino groups, and the first layer of adhesive comprises the polymer having acidic groups.

5. A method according to claim 1 wherein the macromolecular organic binder having amino or substituted amino groups comprises a polymer having repeating units derived from a dialkylaminoalkyl acrylate or methacrylate.

6. A method according to claim 5 wherein the macromolecular organic binder comprises a copolymer of at least one dialkylaminoalkyl acrylate or methacrylate with at least one alkyl acrylate or methacrylate.

7. A method according to claim 6 wherein the macromolecular organic binder comprises a copolymer of:
   from 0 to about 10 parts by weight of butyl acrylate;
   from about 65 to about 95 parts by weight of butyl methacrylate; and
   from about 5 to about 25 parts by weight of N,N-dimethylaminoethyl acrylate.

8. A method according to claim 1 wherein the photopolymerizable monomer comprises a di- or higher functional acrylate or methacrylate.

* * * * *